United States Patent [19]
Ito et al.

[11] Patent Number: 5,104,581
[45] Date of Patent: Apr. 14, 1992

[54] TRAY FOR INTEGRATED CIRCUIT

[75] Inventors: Toshihiro Ito, Nobeoka; Tetsushi Ogawa; Shigenori Hamaoka, both of Nagoya, all of Japan

[73] Assignees: Asahi Yukizai Kogyo Co., Ltd., Miyazaki; Inoue MTP Co., Ltd., Aichi, both of Japan

[21] Appl. No.: 415,781

[22] Filed: Oct. 2, 1989

[30] Foreign Application Priority Data

Dec. 15, 1988 [JP] Japan .................. 63-315071

[51] Int. Cl.$^5$ ............................................. H01B 1/06
[52] U.S. Cl. .................... 252/511; 252/506; 252/508; 252/518; 252/521; 252/509; 523/457; 523/459; 523/468
[58] Field of Search ............... 252/506, 511, 508, 518, 252/521, 509; 523/457, 459, 468

[56] References Cited

U.S. PATENT DOCUMENTS

| | | | |
|---|---|---|---|
| 4,715,989 | 12/1987 | Sullivan et al. | 252/511 |
| 4,783,279 | 11/1988 | Petermann et al. | 252/511 |
| 4,835,240 | 5/1989 | Togashi et al. | 252/511 |
| 4,876,033 | 10/1989 | Jürgen et al. | 252/511 |

FOREIGN PATENT DOCUMENTS 58-214210 12/1983 Japan .
61-285241 12/1986 Japan .
61-287951 12/1986 Japan .

*Primary Examiner*—Josephine Barr
*Attorney, Agent, or Firm*—Burns, Doane, Swecker & Mathis

[57] ABSTRACT

A tray for an integrated circuit comprising a thermosetting resin compound comprising 20 to 180 parts by weight of a filler with a water absorption of 0.45% or less and 15 to 45 parts by weight of electroconductive carbon black added to 100 parts by weight of a thermosetting resin with a water adsorption of 0.45% or less, desirably with 5 to 15 parts by weight of an acrylonitrile-butadiene type rubber, said tray having a surface resistance of $10^2$ to $10^6$ Ω, a water absorption of 0.45% or less than a glass transition temperature of 150° C. or higher.

12 Claims, 3 Drawing Sheets

TRAY FOR INTEGRATED CIRCUIT

BACKGROUND OF THE INVENTION

1. Technical Field of the Invention

This invention relates to a tray for an integrated circuit or large scale integrated circuit (hereinafter referred to jointly as an IC), more particularly, to an IC tray having a small water absorption, a low surface resistance, and in some cases a low specific gravity, but having an excellent heat resistance with little change after prolonged storage.

2. Description of the Related Art

In the prior art a plate tray having a large number of product housing portions comprising, for example, concave groove portions formed thereon, is used for holding and conveying an IC during the baking (heat curing) of an encapsulating material such as epoxy resin molding compound in the final step of the IC production line, and the packaging step subsequent to that step.

There are two kinds of such trays, one made of a metal such as stainless steel or aluminum and the other made of a plastic such as polystyrene or polypropylene to which an electroconductivity has been imparted; the former is used in the heat curing step of the above encapsulating material and the latter is used in the product packaging step.

These prior art techniques, however, have problems such as a poor heat resistance and a lowering of the working efficiency of the process. To solve these problems, an IC tray based on a phenol resin is now under development, and is partly disclosed in Japanese Unexamined Patent Publication (Kokai) Nos. 61-285241 and 61-287951. The trays disclosed in these specifications, although having an excellent heat resistance, are defective from the viewpoint of impact resistance and specific gravity. The present inventors made various investigations into these problems and developed an IC tray by which they were solved.

The above IC tray developed by the inventors is characterized by having a low surface resistance, particularly a low specific gravity of 1.45 or less, and an excellent heat resistance with little deformation after heating. This IC tray is molded from a phenol resin molding comprising a natural fibrous filler and electroconductive carbon black added in a matrix comprising a resol type phenolic resin and an acrylonitrile-butadiene type rubber.

Nevertheless, the IC tray comprising this material, although having excellent initial characteristics, had different problems of warp generation and changes in dimensions due to expansion. These changes became extreme after prolonged storage at room temperature atmosphere (e.g., after 3 months in a room temperature atmosphere). Note, if these changes in the IC tray are, it is difficult to set an IC on tray by a robot, and thus the IC tray is practically useless. Further, if trays having an IC set thereon are stacked for storage, where an extreme change occurs, gaps are formed between the IC trays, and thus the IC is not completely fixed thereon.

For the reasons given above, although it depends on the shape and the size of the IC tray, IC manufactures are currently performing a strict quality control by setting management standard values of 1 mm or less for warping and a dimensional change rate of 0.15 to 0.20% in the case of products usually shaped as plates.

SUMMARY OF THE INVENTION

The present invention has been created in view of the above problems, and an object thereof is to provide an IC tray primarily shaped as plate, having a small water absorption, low surface resistance, and in some cases a low specific gravity and little change such as warping and dimensional variations after prolonged storage in a room temperature atmosphere, namely these are maintained within the management's standard values.

The present inventors accomplished the above object after intensive research and consequently, found that the change over a long period of the IC tray is caused by water absorption of the IC tray itself, and that the desired IC tray can be obtained by using a thermosetting resin and a filler with a small water absorption.

More specifically, the present invention concerns an IC tray which comprises a thermosetting resin molding compound comprising 20 to 180 parts by weight of a filler with a water absorption of 0.45% or less and 15 to 45 parts by weight of electroconductive carbon black added to 100 parts by weight of a thermosetting resin with a water absorption of 0.45% or less, and having a surface resistance of $10^2$ to $10^6$ $\Omega$, a water absorption of 0.45% or less, and a glass transition temperature of 150° C. or higher.

Further, the present invention concerns an IC tray having a specific gravity of 1.45 or less obtained by using a filler with a specific gravity of 1.45 or less, and an IC tray having a specific gravity of 1.45 or less obtained by adding an acrylonitrile-butadiene type rubber, and having a surface resistance of $10^2$ to $10^6$ $\Omega$, a water absorption of 0.45%, and a glass transition temperature of 150° C. or higher.

DESCRIPTION OF THE PREFERRED EMBODIMENTS

Figure 1:
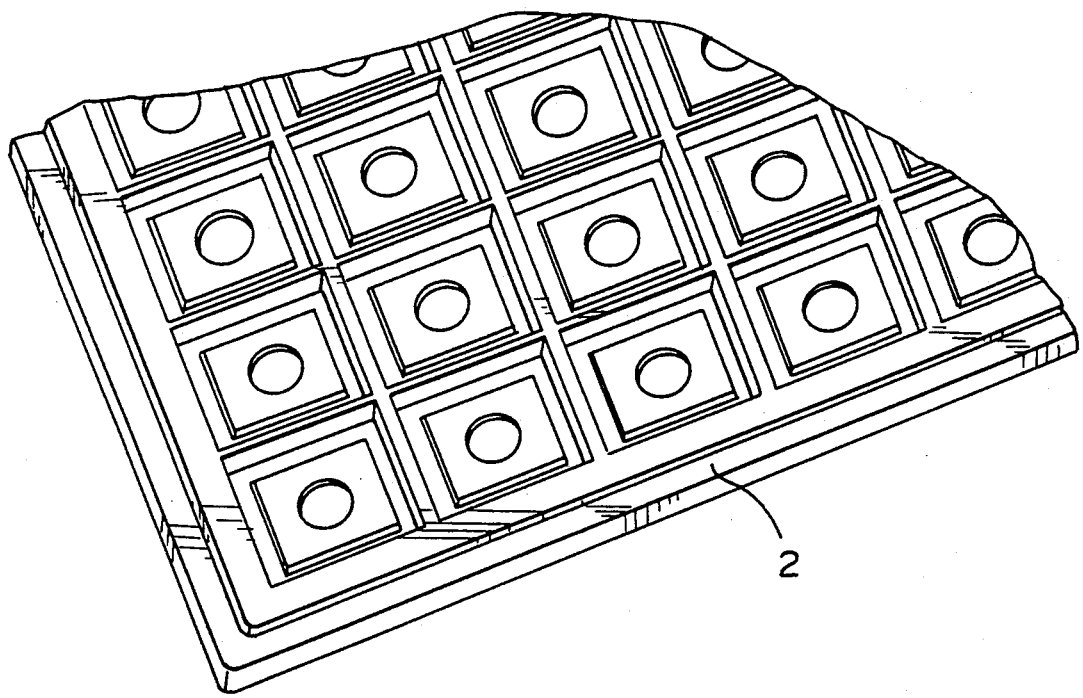
FIG. 1 is a partial perspective view of an example of the IC tray of the present invention.

The thermosetting resin to be used in the present invention has a water absorption of 0.45% or less, and includes novolac type, resol type or benzylic ether type phenol resin, epoxy resin, melamine resin, diallyl phthalate resin or unsaturated polyester resin, which can be used alone or in a mixture. Among these thermosetting resins, diallyl phthalate resin and unsaturated polyester resin, particularly hydrogenated bisphenolic type unsaturated polyester resin, are most preferably used, as the use thereof ensures that there will be no generation of halogen ions or amine type gases, which corrode the metals used for IC's during the heat curing, and further, the generation of volatile components such as water, as in phenolic resins, will not occur because the curing proceeds through a radical reaction. If the thermosetting resin has a water absorption higher than 0.45%, the IC tray obtained has a higher in water absorption whereby the change over a long period, such as warping and dimensional variations, will become undesirably greater.

The water absorption as referred to in the present invention is a numerical value measured on the basis of JIS K 6911 for the thermosetting resin and the IC tray, and based on JIS A 1190 for the filler, which indicates a measure of the water absorption characteristic in the above respective starting materials and the IC tray.

The filler to be used in the present invention has a water absorption of 0.45% or less, and includes fibrous materials such as glass fiber, carbon fiber, and Aramide fiber, inorganic materials such as mica powder, calcium carbonate powder, alumina powder, silica powder, and ceramic balloon, and organic materials such as cured phenolic resin powder, and cured melamine resin powder. Among these, in particularly mica powder is preferably used as a material effectively preventing warping. If the filler has a water absorption higher than 0.45%, the IC tray obtained has a higher water absorption, whereby the warping and dimensional changes will become undesirably greater. To obtain an IC tray with a specific gravity of 1.45 or less, a filler with a specific gravity of 1.45 or less is preferably employed, and a ceramic balloon, cured phenolic resin powder or cured melamine resin powder are most preferable. Among fillers with a specific gravity of 1.45 or less, a cured phenolic resin powder is most preferably employed, as it has a good wettability with thermoplastic resin and will not be precipitated onto the surface of the IC tray, whereby a good appearance can be obtained. The respective fillers can be used either alone or as a mixture thereof.

The filler is preferably used in an amount of 20 to 180 parts by weight, or when obtaining a tray with a specific gravity of 1.45 or less, in an amount of 20 to 120 parts by weight, per 100 parts by weight of the thermosetting resin. If the amount is lower than the lower limit of these ranges, bubbles are liable to be generated during molding of the IC tray, and if it is higher than the upper limit, the moldability will be lowered or to extremely lower the strength of the IC tray.

Even when IC trays with a specific gravity of 1.45 or less are formed by using the starting materials as described above as the main starting materials, depending on the shape of the trays (e.g. complicated shapes with many ribs, or large scale shapes with large dimensions), some of these trays may still suffer from a generation of warping due to a nonuniform dispersion of stress. In such a case, to uniformalize the dispersion by relaxing the stress, an acrylonitrile-butadiene type rubber (hereinafter abbreviated as NBR rubber) may be formulated. As the NBR type rubber, those generally known in the art can be used, but particularly partially crosslinked type NBR or carboxylated NBR which are shaped as bales, powders or a latex are most preferable and may be used either alone or as a mixtures thereof. These NBR type rubbers are particularly preferable as they retain a high degree of elasticity at high temperatures.

The NBR type rubber is preferably contained within the range of 5 to 15 parts by weight based on 100 parts by weight of the above thermosetting resin. If the amount is smaller than 5 parts by weight, a reinforcing effect and warping prevention effect as rubber component cannot be obtained, and if exceeding 15 parts by weight, the flexural and tensile strengths of the IC tray will be lowered, and further, glass transition temperature will become 150° C. or lower to undesirably lower the heat resistance.

The electroconductive carbon black to be used in the present invention may include those generally known in the art, particularly preferably acetylene black and furnace black ECF, which can be used either alone or as a mixture thereof.

The electroconductive carbon black is preferably used in an amount of 15 to 45 parts by weight based on 100 parts by weight of the thermosetting resin. If the amount is smaller than 15 parts by weight, the surface resistance becomes greater than $10^6$ Ω whereby the antistatic effect is lowered, and if exceeding 45 parts by weight, the surface resistance becomes as low as $10^2$ Ω, whereby a current can be easily passed. Also, the moldability is poor, and the strength of the IC tray will be undesirably lowered.

The thermosetting resin molding compound in the present invention is constituted of the above respective starting materials as the main components, but other materials such as curing catalysts, curing accelerators, mold release agents, flowability impairing agents, flame retardants or dyes or pigments may be added thereto as desired. The thermosetting resin molding compound can be obtained in a conventional manner by heating and kneading, followed by granulation or pulverization. The flow of the thermosetting resin molding compound can be set by the disc method at 90 to 105 mm for an IC tray with a high specific gravity, and at about 105 to 120 mm for an IC tray with a low specific gravity.

The IC tray of the present invention can be obtained by compression molding, transfer molding, or injection molding, using the thermosetting resin molding compound obtained by formulation of the above main starting materials, and having a surface resistance of $10^2$ to $10^6$ Ω, an absorption of 0.45% or less, and a glass transition temperature of 150° C. or higher. Further, depending on the selection of starting materials, in addition to the above characteristic, the IC tray has a specific gravity of 1.45 or less.

If the surface resistance is greater than $10^6$ Ω, the IC tray is charged with static electricity, and the IC will be damaged. If this resistance is smaller than $10^2$ Ω, the IC tray will allow a current to pass, which will have an adverse affect on the IC.

Next, when the absorption becomes higher than 0.45%, the warping and dimensional changes over a long period become greater, and the IC can be easily damaged during the baking step, in addition to the generation of the problems mentioned above, and further defects will occur when the trays are stacked and conveyed.

The specific gravity is not particularly limited, but if smaller than 1.45, the weight of the IC tray is reduced, particularly reducing the burden on works during the conveying of the trays, and particularly, when transported by air the product transportation costs can be greatly reduced.

Further, if the glass transition temperature is lower than 150° C., deformation will occur in the heat curing step of the IC encapsulating material, and the tray will be practically useless as an IC tray. Also, the IC tray may be used repeatedly in that step, but such a repeated use will be impossible if deformation occurs.

The IC tray of the present invention can be given a greater heat resistance by post-curing, for example, at 160° to 200° C. for 2 to 6 hours.

The IC tray is generally in the shape of a plate, and is provided with a large number of concave grooves for fixing and arranging IC and ribs thereon. The IC tray having such a shape obviously is hygroscopic, and thus the dimensions may be slightly increased, by a gradually absorption of water in the air. Accordingly, due to generation of subtle differences in stress at respective portions of the IC tray, the balance in stress may be lost and warping occur.

The feature of the present invention resides in the constituting of an IC tray having a low water absorption, by using a thermosetting resin and a filler with a low water absorption, i.e., a low hygroscopicity, to thereby suppress moisture absorption as much as possible.

With regard to warping of the IC tray, although the influence of the density balance at respective portions may be considered, this can be solved by using an appropriate molding method. Since the IC tray of the present invention has a water absorption of 0.45% or lower, the absorption of water in the air is small, and therefore, any change of dimensions is small. Further because of this small change in dimensions, stress generated at the respective portions of the IC tray is also small, and the balance therebetween can be prevented from becoming greatly unbalanced, whereby a generation of warping can be suppressed as much as possible.

The present invention is now described with reference to Examples, which in no way limit the scope of this invention.

The physical properties of the molding compound, the warping, and the dimensional change rate of the IC tray were measured by the methods shown below.

(1) Flexural strength, Charpy impact strength, water absorption, specific gravity: according to JIS K-6911.

(2) Surface resistance: measured with a shrunken strip, based on JIS K-6911, by a tester manufactured by HIOKI. E.E Kabushiki Kaisha.

Measuring method

The code terminals of the tester are placed in contact with tow diametrically opposed points on the outer circumferential side surface of a cyclic raised portion of the shrunken strip, and the numerical values are measured.

the measurements were made for one shrunken strip.

The surface resistance of this Example was shown in terms of the average value of the measured values at 12 points as a total of three shrunken strips.

(3) Glass transition temperature

Using a thermal analysis device (manufactured by Shimazu Seisakusho), on correlation graph of elongation (%)—temperature (°C.) was prepared, and glass transition temperature (°C.) was determined from the graph.

Measurement conditions

Test strip: round rod, 5φ×10 mm
Temperature elevation rate: 5° C./min.
Measurement temperature: Room temperature to 200° C.

(4) Warping (normal state and after 3 months under room)

A plate tray as partly shown in FIG. 1, 300×200×5 mm, was molded by compression molding under a molding temperature of 170° C., a molding pressure of 300 kg/cm², and a curing time of 150 sec., and warping in the normal state and after 3 months under room temperature were measured by the following method.

Measurement method

Figure 2:
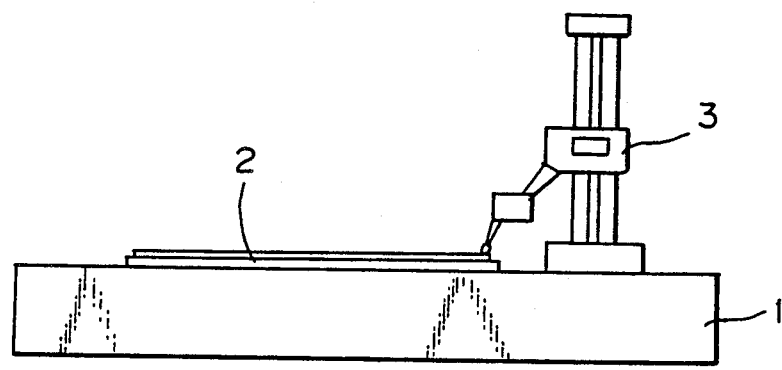
FIG. 2 is a front view showing the method of measuring warping of the IC tray.
Figure 3:
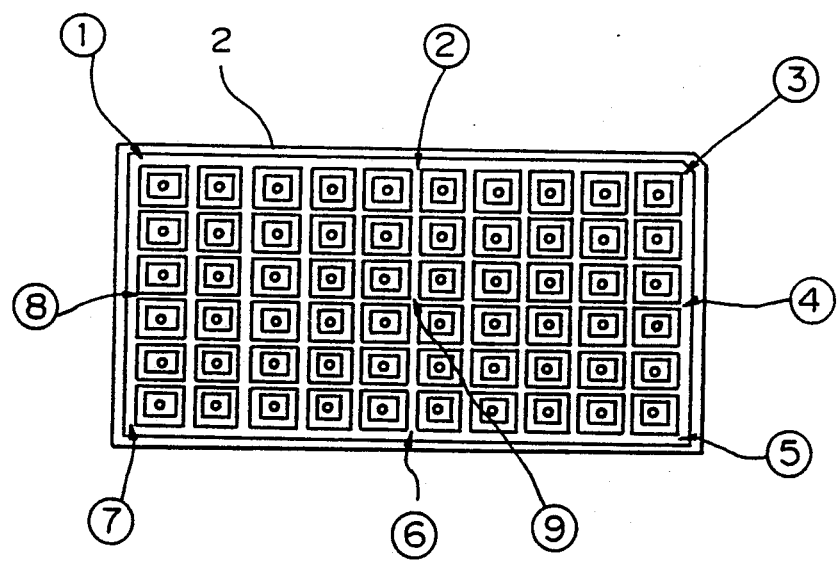
FIG. 3 is a plane view of the IC tray showing the height measuring points.

As shown in FIG. 2, an IC tray 2 and a height gauge 3 (manufactured by Mitsutoyo) were placed on a platen 1 to make the surface of the platen a standard (0 mm) with the height gauge 3 and as shown in FIG. 3, with 9 sites on the same plane at the upper surface of the IC tray (8 sites being at the peripheral portion of the IC tray, and 1 at the central portion) as the measuring points, the heights at the respective 9 points were measured.

The difference between the maximum value and the minimum value of the measured values at the 9 points was defined as "warping".

(5) Dimensional change rate (after 3 months under room temperature atmosphere)

By compression molding under a mold temperature of 170° C., a molding pressure of 300 kg/cm², and a curing time of 150 seconds, a plate tray 300×200×5 mm (FIG. 1) was molded. The dimensions int he normal state and after 3 months under room temperature were measured by the following method, and the dimensional changes form the normal state to that after 3 months under room temperature atmosphere were determined.

Measurement method

Figure 4:
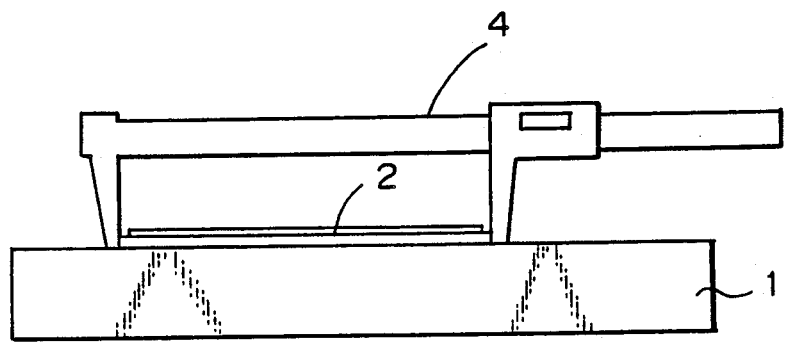
FIG. 4 is a front view of the IC tray showing the method of measuring the dimensions of the IC tray.
Figure 5:
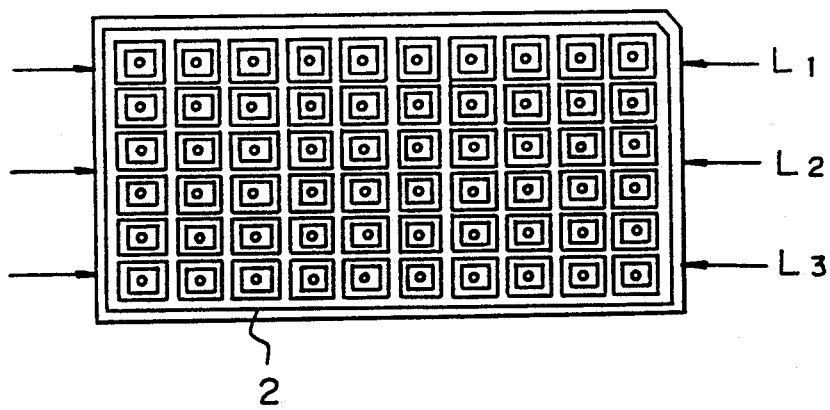
FIG. 5 is a plane view of the IC tray showing the dimension measuring sites.

As shown in FIG. 4, an IC tray 2 was placed on a platen 1, and the entire length int he longitudinal direction of the IC tray was measured at a 3 points on the central portion L2 and both end portions L1 and L3 by a dial system caliper (manufactured by Mitsutoyo), and the average value was divided by a value obtained by a similar measurement of the initial dimension, to give the dimensional change rate as shown int he following formula.

$$\text{Dimensional change rate} = \frac{L - L_0}{L_0} \times 100$$

L: average value of initial entire length in the longitudinal direction $L_0$: average value of entire length in the longitudinal direction after an elapse of time The dimensional change rate in the Examples was shown in terms of the average value of values measured on 10 tray, determined by the above formula.

EXAMPLE 1

| | |
|---|---|
| Diallyl phthalate resin (manufactured by Osaka Soda) | 100 wt. part |
| Glass fiber (3 m/m) | 150 wt. part |
| Acetylene black (manufactured by Denki Kagaku) | 30 wt. part |
| Curing catalyst (manufactured by Kayaku Nooly) | 5 wt. part |

The above starting materials were dispersed and mixed uniformly in a Henschel mixer together with suitable amounts of a curing accelerator, a mold release agent and a solvent kneaded on hot rolls (100°/90° C.) for 5to 7 minutes, and produced in the form of a sheet. The sheet compound was pulverized to a suitable size to obtain a moldable diallyl phthalate resin molding compound. The disc flow of the compound was 105 mm.

Using this molding compound, compression molding was performed under a mold temperature of 160 to 180° C., a compression pressure of 200 to 400 kg/cm², and a curing time of 120 to 180 sec., to prepare test pieces for the test, and the respective properties of the flexural strength, Charpy impact strength, surface resistance, water absorption, and specific gravity were measured.

Also, the glass transition temperature, warping of the plate tray (normal state and after 3 months under room temperature), dimensional change rate (after 3 months under room temperature) were measured under the above conditions.

EXAMPLE 2–13

Molding compound were prepared in the same manner as in Example 1, using the starting materials and formulation ratios shown in Table 1, and after molding the test pieces, the physical properties thereof similarly measured. The results are shown in Table 2.

COMPARATIVE EXAMPLES 1–8

Molding materials were prepared in the same manner as in Example 1, using the starting materials formulation ratios shown in Table 3, and after molding the test pieces, the physical properties thereof were similarly measured. The results are shown in Table 4.

Various thermosetting resins, phenolic resin cured products, ceramic balloons, glass fibers and micas used in Examples 1–13 and Comparative examples 1–8 all had a water absorption of 0.45% or less, but the cellulose had a water absorption of 7%.

As can be understood from the results shown in Table 2 and Table 4, the amount of change from the normal state to that after 3 months under room temperature in Examples 1 to 13 is 0.2 to 0.6 mm, and the dimensional change rate remains at +0.05 to 0.15%. Namely, the management standard values of the IC manufacturer are maintained. In contrast, the change in the amount of warping of Comparative examples 1–8 is 0.9 to 2.0 mm and the dimensional change rate is +0.20 to 0.45%, which are higher than the standard values of the IC manufacturer. Thus, the IC tray of the present invention can be clearly understood to have an excellent resistance to warping and dimensional change after prolonged storage.

EFFECT OF THE INVENTION

As described above, the IC tray of the present invention has an excellent electroconductivity, heat resistance, and mechanical strength (impact strength), and suffers little change such as warping and in dimensions after prolonged storage because of a low water absorption thereof.

Therefore, the IC tray of the present invention can be used without problems even after prolonged storage, in the production of an IC or LSI. Namely, the IC can be easily set on a tray by a robot and the trays housing an IC therein can be stacked for longer term storage.

Further, due to the small warping of the tray, it can be used repeatedly in the heat curing step, etc., and conveying and packaging of the products can be easily carried out whereby costs are reduced and the working efficiency improved.

TABLE 1

| | Unit | 1 | 2 | 3 | 4 | 5 | 6 | 7 | 8 | 9 | 10 | 11 | 12 | 13 |
|---|---|---|---|---|---|---|---|---|---|---|---|---|---|---|
| | | | | | | | | Example | | | | | | |
| Diallyl phthalate resin (manufactured by Osaka Soda) | wt. parts | 100 | | 50 | 100 | 100 | | 50 | 100 | 70 | 100 | | 50 | 100 |
| Hydrogenated bisphenol type unsaturated polyester resin (manufactured by Nippon Upica) | wt. parts | | 100 | 50 | | | 100 | 50 | | 30 | | 100 | 50 | |
| Curing catalyst (manufactured by Kayaku Nooly) | wt. parts | 5 | 5 | 5 | 5 | 5 | 5 | 5 | 5 | 5 | 5 | 5 | 5 | 5 |
| Phenolic resin cured product (manufactured by Asahi Yukizai Kogyo) | wt. parts | | | | | 60 | 60 | 60 | | 40 | 50 | 50 | 80 | 50 |
| Ceramic balloon | wt. parts | | | | | | | | 60 | | | | | |
| Glass fiber | wt. parts | 150 | 160 | 140 | 50 | 15 | 25 | 15 | 15 | 15 | 15 | 15 | 15 | 15 |
| Mica | wt. parts | | | | 100 | | | | 10 | | | | | 10 |
| Acetylene black (manufactured by Denki Kagaku) | wt. parts | 30 | 30 | 35 | 30 | 40 | 30 | 30 | 35 | 30 | 40 | 30 | 30 | 30 |
| Partially crosslinked NBR | wt. parts | | | | | | | | | | 10 | 8 | 10 | 12 |
| Disk flow of molding material | m/m | 105 | 112 | 108 | 99 | 114 | 118 | 115 | 106 | 110 | 110 | 115 | 113 | 112 |

TABLE 2

| | Unit | 1 | 2 | 3 | 4 | 5 | 6 | 7 |
|---|---|---|---|---|---|---|---|---|
| | | | | | Example | | | |
| Flexural strength | kg/mm$^2$ | 12.0 | 9.5 | 11.5 | 9.2 | 8.5 | 7.5 | 7.8 |
| Charpy impact strength | kg · cm/cm$^2$ | 3.6 | 3.8 | 3.5 | 2.9 | 2.0 | 2.8 | 2.4 |
| Surface resistance | Ω | 3 × 10$^4$ | 8 × 10$^4$ | 2 × 10$^4$ | 1 × 10$^5$ | 5 × 10$^3$ | 8 × 10$^4$ | 7 × 10$^4$ |
| Water absorption | % | 0.10 | 0.30 | 0.19 | 0.12 | 0.30 | 0.40 | 0.33 |
| Specific gravity | — | 1.70 | 1.72 | 1.69 | 1.78 | 1.35 | 1.38 | 1.35 |
| Glass transition temperature | °C. | 169 | 158 | 161 | 168 | 165 | 157 | 158 |
| Warping (normal state) | mm | 0.4 | 0.5 | 0.6 | 0.3 | 0.5 | 0.8 | 0.8 |
| Warping (after 3 month | mm | 0.6 | 0.8 | 0.9 | 0.7 | 0.8 | 1.0 | 1.0 |

TABLE 2-continued

| | | | | | | | |
|---|---|---|---|---|---|---|---|
| under room temperature atmosphere) | | | | | | | |
| Dimensional change rate (after 3 months under room temperature atmosphere) | % | +0.05 | +0.09 | +0.08 | +0.07 | +0.07 | +0.13 | +0.11 |

| | | Example | | | | | |
|---|---|---|---|---|---|---|---|
| | Unit | 8 | 9 | 10 | 11 | 12 | 13 |
| Flexural strength | kg/mm$^2$ | 8.0 | 7.9 | 7.2 | 8.3 | 8.5 | 8.8 |
| Charpy inpact strength | kg·cm/cm$^2$ | 2.0 | 2.3 | 2.9 | 3.2 | 3.3 | 2.2 |
| Surface resistance | Ω | $2 \times 10^4$ | $6 \times 10^4$ | $4 \times 10^4$ | $6 \times 10^4$ | $1 \times 10^5$ | $8 \times 10^4$ |
| Water absorption | % | 0.07 | 0.36 | 0.39 | 0.28 | 0.25 | 0.20 |
| Specific gravity | — | 1.36 | 1.36 | 1.33 | 1.35 | 1.34 | 1.42 |
| Glass transition temperature | °C. | 166 | 160 | 153 | 151 | 154 | 156 |
| Warping (normal state) | mm | 0.4 | 0.7 | 0.7 | 0.4 | 0.4 | 0.3 |
| Warping (after 3 month under room temperature atmosphere) | mm | 0.7 | 1.0 | 1.0 | 1.0 | 0.8 | 0.9 |
| Dimensional change rate (after 3 months under room temperature atmosphere) | % | +0.05 | +0.10 | +0.14 | +0.13 | +0.15 | +0.11 |

TABLE 3

| | | Comparative example | | | | | | | |
|---|---|---|---|---|---|---|---|---|---|
| | Unit | 1 | 2 | 3 | 4 | 5 | 6 | 7 | 8 |
| Diallyl phthalate resin (manufactured by Osaka Soda) | wt. parts | | | 100 | 100 | 100 | | | 100 |
| Hydrogenated bisphenol Type unsaturated polyester resin (manufactured by Nippon Upica) | wt. parts | | | | | | 100 | | |
| Benzylic ether type phenol resin (manufactured by Asahi Yukizai Kogyo) | wt. parts | 100 | 100 | | | | | 100 | |
| Curing catalyst (manufactured by Kayaku Nooly) | wt. parts | | | 5 | 5 | 5 | 5 | | 5 |
| Phenolic resin cured product (manufactured by Asahi Yukizai Kogyo) | wt. parts | | | | 15 | 150 | 60 | | 60 |
| Cellulose | wt. parts | 30 | 60 | 60 | | | | 50 | |
| Glass fiber | wt. parts | 120 | | | 15 | 15 | 15 | | 15 |
| Acetylene black (manufactured by Denki Kagaku) | wt. parts | 30 | 35 | 35 | 30 | 30 | 10 | 35 | 30 |
| Partially crosslinked NBR | wt. parts | | | | | | | 10 | |
| EPDM | wt. parts | | | | | | | | 10 |
| Disk flow of molding compound | m/m | 110 | 130 | 125 | 135 | 118 | 112 | 113 | 116 |

TABLE 4

| | | Comparative example | | | | | | | |
|---|---|---|---|---|---|---|---|---|---|
| | Unit | 1 | 2 | 3 | 4 | 5 | 6 | 7 | 8 |
| Flexural strength | kg/mm$^2$ | 10.0 | 7.6 | 7.0 | 6.4 | 3.0 | 6.8 | 7.5 | 6.2 |
| Charpy inpact strength | kg·cm/cm$^2$ | 2.0 | 1.8 | 1.3 | 1.5 | 0.9 | 1.9 | 2.2 | 2.1 |
| Surface resistance | Ω | $8 \times 10^4$ | $6 \times 10^5$ | $1 \times 10^5$ | $8 \times 10^4$ | $5 \times 10^5$ | $5 \times 10^7$ | $5 \times 10^4$ | $2 \times 10^5$ |
| Water absorption | % | 0.46 | 0.58 | 0.62 | 0.50 | 0.55 | 0.45 | 0.60 | 0.40 |
| Specific gravity | — | 1.67 | 1.39 | 1.37 | 1.40 | 1.42 | 1.39 | 1.41 | 1.35 |
| Glass transition temperature | °C. | 180 | 158 | 154 | 155 | 158 | 160 | 154 | 125 |
| Warping (normal state) | mm | 1.0 | 1.1 | 1.2 | 0.8 | 0.9 | 0.7 | 0.5 | 2.0 |
| Warping (after 3 month under room temperature atmosphere) | mm | 2.1 | 2.4 | 2.3 | 1.8 | 2.0 | 1.6 | 2.5 | 2.5 |
| Dimensional change rate (after 3 months under room temperature atmosphere) | % | +0.41 | +0.43 | +0.38 | +0.40 | +0.35 | +0.20 | +0.45 | +0.21 |

We claim:

1. A tray for an integrated circuit comprising a thermosetting resin molding compound comprising 20 to 180 parts by weight of a filler comprising a member selected from the group consisting of fibrous material, inorganic powder material, organic powder material and mixtures thereof with a water absorption of an effective amount of not more than 0.45% and 15 to 45 parts by weight of electroconductive carbon black added to 100 parts by weight of a thermosetting resin with a water absorption of an effective amount of not more than 0.45%, said tray having a surface resistance of $10^2$ to $10^6$ Ω, a water absorption of an effective amount of not more than 0.45% and a glass transition temperature of not less than 150° C.

2. A tray for an integrated circuit according to claim 1, wherein the thermosetting resin comprises a member selected from the group consisting of a phenolic resin, an epoxy resin, a melamine resin, a diallyl phthalate resin and an unsaturated polyester resin.

3. A tray for an integrated circuit according to claim 1, wherein the thermosetting resin is at least one of a diallyl phthalate resin and an unsaturated polyester resin.

4. A tray for an integrated circuit according to claim 1, wherein the filler comprises a member selected form the group consisting of glass fiber, carbon fiber, Aramide fiber, mica powder, calcium carbonate powder, alumina powder, silica powder, ceramic balloon, cured phenolic resin powder and cured melamine resin powder.

5. A tray for an integrated circuit comprising a thermosetting resin molding compound comprising 20 to 120 parts by weight of a filler with a water absorption of an effective amount of not more than 0.45% and a specific gravity of an effective amount of not more than 1.45, and 15 to 45 parts by weight of a thermosetting resin with a water absorption of an effective amount of not more than 0.45%, said tray having a surface resistance of $10^2$ to $10^6$ Ω, a water absorption of an effective amount of not more than 0.45%, a specific gravity of not more than 1.45 and a glass transition temperature of not less than 150° C.

6. A tray for an integrated circuit according to claim 5, wherein the thermosetting resin comprises a member selected from the group consisting of a phenolic resin, an epoxy resin, a melamine resin, a diallyl phthalate resin and an unsaturated polyester resin.

7. A tray for an integrated circuit according to claim 5, wherein the thermosetting resin is at least one of a diallyl phthalate resin and an unsaturated polyester resin.

8. A tray for an integrated circuit according to claim 5, wherein the filler comprises a member selected from the group consisting of glass fiber, carbon fiber, Aramide fiber, mica powder, calcium carbonate powder, alumina powder, silica powder, ceramic balloon, cured phenolic resin powder and cured melamine resin powder.

9. A tray for an integrated circuit comprising a thermosetting resin molding compound, comprising 20 to 120 parts by weight of a filler comprising a member selected from the group consisting of fibrous material, inorganic powder material, organic powder material and mixture thereof with a water absorption of an effective amount of not more than 0.45% and a specific gravity of not more than 1.45, 5 to 15 parts by weight of an acrylonitrile-butadine type rubber and 15 to 45 parts by wight of electroconductive carbon black added to 100 parts by weight of a thermosetting resin with a water absorption of an effective amount of not more than 0.45%, said tray having a surface resistance of $10^2$ to $10^6$ Ω, a water absorption of an effective amount of not more than 0.45%, a specific gravity of 1.45 or less and a glass transition temperature of not less than 150° C.

10. A tray for an integrated circuit according to claim 9, wherein the thermosetting resin comprises a member selected from the group consisting of a phenolic resin, an epoxy resin, a melamine resin, a diallyl phthalate resin and an unsaturated polyester resin.

11. A tray for an integrated circuit according to claim 9, wherein the thermosetting resin is at least one of a diallyl phthalate resin and an unsaturated polyester resin.

12. A tray for an integrated circuit according to claim 9, wherein the filler comprises a member selected from the group consisting of glass fiber, carbon fiber, Aramide fiber, mica powder, calcium carbonate powder, alumina powder, silica powder, ceramic balloon, cured phenolic resin powder and cured melamine resin powder.

* * * * *

UNITED STATES PATENT AND TRADEMARK OFFICE
CERTIFICATE OF CORRECTION

PATENT NO. : 5,104,581
DATED : April 14, 1992
INVENTOR(S) : Toshihiro ITO et al.

It is certified that error appears in the above-indentified patent and that said Letters Patent is hereby corrected as shown below:

Column 11, line 25, after "parts", please insert --by weight of electroconductive carbon black added to 100 parts--.

Signed and Sealed this

Thirteenth Day of February, 1996

Attest:

BRUCE LEHMAN

*Attesting Officer*   *Commissioner of Patents and Trademarks*